(12) United States Patent
Jun

(10) Patent No.: US 10,375,866 B2
(45) Date of Patent: *Aug. 6, 2019

(54) FAN TRAY PERFORATION PATTERN

(71) Applicant: CISCO TECHNOLOGY, INC., San Jose, CA (US)

(72) Inventor: Frank S. Jun, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 503 days.

This patent is subject to a terminal disclaimer.

(21) Appl. No.: 15/092,091

(22) Filed: Apr. 6, 2016

(65) Prior Publication Data

US 2016/0219760 A1 Jul. 28, 2016

Related U.S. Application Data

(63) Continuation of application No. 13/645,282, filed on Oct. 4, 2012, now Pat. No. 9,334,879.

(51) Int. Cl.
| | |
|---|---|
| *H05K 7/20* | (2006.01) |
| *H05K 9/00* | (2006.01) |
| *F04D 25/06* | (2006.01) |
| *F04D 29/70* | (2006.01) |
| *B21D 53/00* | (2006.01) |
| *B21D 28/26* | (2006.01) |
| *F04D 17/16* | (2006.01) |
| *F04D 29/02* | (2006.01) |

(Continued)

(52) U.S. Cl.
CPC ........... *H05K 9/0041* (2013.01); *B21D 28/26* (2013.01); *B21D 53/00* (2013.01); *F04D 17/16* (2013.01); *F04D 25/0613* (2013.01); *F04D 29/023* (2013.01); *F04D 29/281* (2013.01); *F04D 29/4226* (2013.01); *F04D 29/441* (2013.01); *F04D 29/703* (2013.01); *G06F 1/182* (2013.01); *Y10T 83/0524* (2015.04); *Y10T 428/24298* (2015.01)

(58) Field of Classification Search
CPC . F26B 5/06; A61K 9/19; F04D 29/703; F04D 25/0613; H05K 7/20; B21D 53/00; Y10T 83/0524; Y10T 428/24298
USPC .................... 415/121.2, 213.1; 361/695
See application file for complete search history.

(56) References Cited

U.S. PATENT DOCUMENTS

| | | | |
|---|---|---|---|
| 5,460,571 A * | 10/1995 | Kato | F04D 29/703 454/184 |
| 6,549,406 B1 * | 4/2003 | Olesiewicz | H05K 7/20581 361/695 |

(Continued)

*Primary Examiner* — Aaron R Eastman
(74) *Attorney, Agent, or Firm* — Polsinelli PC

(57) ABSTRACT

An apparatus is provided in one example embodiment and includes a plate having a plurality of perforations configured in a pattern. The pattern includes the plurality of perforations arranged in concentric circles centered at a point. Each of the perforations is a closed shape comprising four edges, with rounded corners between adjacent edges, with two opposite edges of each of the perforations including non-parallel straight lines and two other opposite edges comprise concentric, offset curved lines. The non-parallel straight lines may form an angle with a vertex at the point, and the concentric curved lines may be centered at the point. The perforations in each concentric circle may be angularly spaced around the point. The apparatus may further include a substantially circular fan.

20 Claims, 9 Drawing Sheets

(51) Int. Cl.
    *F04D 29/28*     (2006.01)
    *F04D 29/42*     (2006.01)
    *F04D 29/44*     (2006.01)
    *G06F 1/18*     (2006.01)

(56) References Cited

U.S. PATENT DOCUMENTS

| | | | | |
|---|---|---|---|---|
| 6,720,774 | B2* | 4/2004 | Meert | H05K 7/20209 |
| | | | | 324/512 |
| 6,776,706 | B2* | 8/2004 | Kipka | H05K 7/20181 |
| | | | | 361/695 |
| 6,921,247 | B2 | 7/2005 | Stewart et al. | |
| 6,985,358 | B2 | 1/2006 | Thompson et al. | |
| 7,054,155 | B1* | 5/2006 | Mease | H05K 7/20581 |
| | | | | 165/104.34 |
| 7,097,556 | B2* | 8/2006 | Su | G06F 1/206 |
| | | | | 361/695 |
| 7,256,995 | B2* | 8/2007 | Wrycraft | H05K 7/1488 |
| | | | | 361/695 |
| 9,334,879 | B2* | 5/2016 | Jun | F04D 25/0613 |
| 2004/0202541 | A1* | 10/2004 | Stewart | F04D 29/601 |
| | | | | 415/213.1 |
| 2007/0081306 | A1* | 4/2007 | Wong | G06F 1/20 |
| | | | | 361/695 |
| 2008/0124234 | A1 | 5/2008 | Echazarreta | |

\* cited by examiner

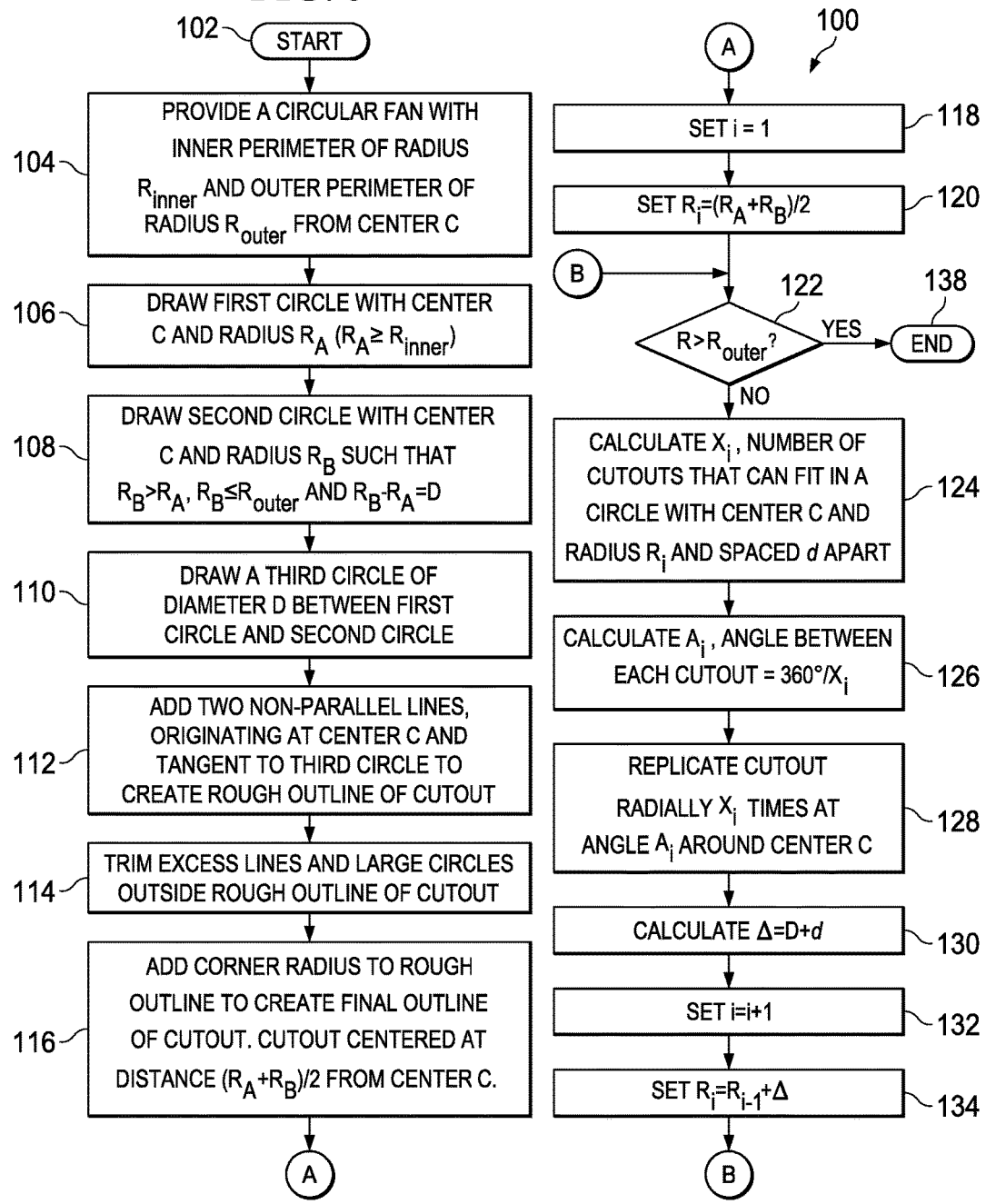

though the claims and/or specification may not be explicitly described.

FAN TRAY PERFORATION PATTERN

RELATED APPLICATION

This Application is a continuation (and claims the benefit of priority under 35 U.S.C. § 120) of U.S. application Ser. No. 13/645,282, filed Oct. 4, 2012, entitled "FAN TRAY PERFORATION PATTERN," Inventor Frank S. Jun. The disclosure of the prior application is considered part of (and are incorporated by reference in) the disclosure of this application.

TECHNICAL FIELD

This disclosure relates in general to the field of computer and networking systems and, more particularly, to a fan tray perforation pattern.

BACKGROUND

Over the past several years, information technology (IT) has seen a tremendous increase in performance of electronic equipment, coupled with a geometric decrease in floor space to house the equipment. Further, increased performance requirements have led to increased energy use as well, resulting in increased heat dissipation within the crowded floor space. For example, the rate of increase of heat density for communications equipment was 13% annually from 1992 through 1998, at which time it increased to 28%, and is projected to continue to increase. As a result, data centers are demanding better thermally managed products that have good computing performance coupled with good thermal performance. Thus, there is a need to design electronic equipment with better thermal characteristics.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 5 is a simplified flow diagram illustrating example operations that may be associated with an embodiment of the fan tray assembly;

DETAILED DESCRIPTION OF EXAMPLE EMBODIMENTS

Overview

An apparatus is provided in one example embodiment and includes a plate having a plurality of perforations configured in a pattern. The pattern includes the plurality of perforations arranged in concentric circles centered at a point. Each of the perforations is a closed shape comprising four edges, with rounded corners between adjacent edges, with two opposite edges of each of the perforations including non-parallel straight lines and two other opposite edges include concentric, offset curved lines. The non-parallel straight lines may form an angle with a vertex at the point, and the concentric curved lines may be centered at the point. The perforations in each concentric circle may be (substantially) angularly spaced around the point.

In a specific embodiment, the apparatus may further include a substantially circular fan having an inner radius corresponding to an inner perimeter of the pattern and an outer radius corresponding to an outer perimeter of the pattern. A smallest one of the concentric circles may have a radius that is approximately equal to the inner radius and a largest one of the concentric circles may have a radius that is approximately equal to the outer radius, such that the pattern overlaps an area of the fan between the inner radius and the outer radius. When the fan rotates, air may be pushed out through the plurality of perforations. In specific embodiments, the plate may comprise a metallic material with an electromagnetic interference (EMI) shielding. The apparatus may be attached to electronic equipment, such as a switch in a network.

EXAMPLE EMBODIMENTS

Figure 1:
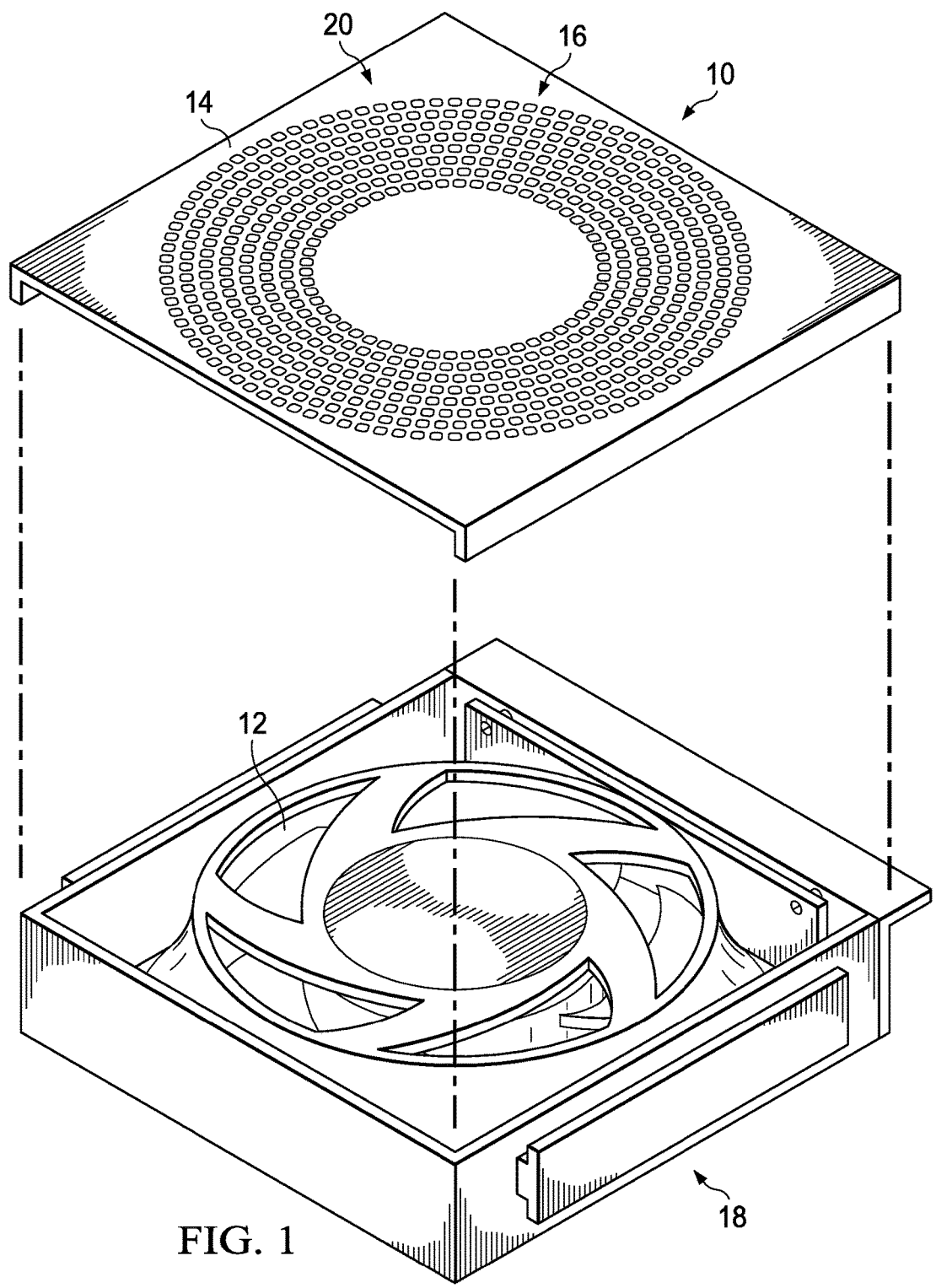
FIG. 1 is a simplified block diagram illustrating an exploded view of a fan tray assembly according to an example embodiment.

Turning to FIG. 1, FIG. 1 is a simplified block diagram illustrating an exploded view of a fan tray assembly 10 in accordance with one example embodiment. Fan tray assembly 10 includes a substantially circular fan 12, and a plate 14, which includes a plurality of perforations 16. As used herein, the term "perforation" includes holes, punctures, and other apertures. The term "plate" can include a relatively thin, rigid body of substantially uniform thickness. Plate 14 may be smooth or flat, and of any desired shape. Plate 14 may include attachments to fasten to other parts of fan tray assembly 10, including fins, brackets, screws, and other fastening mechanisms. In some embodiments, plate 14 may form a portion of an otherwise non-uniform three-dimensional component (e.g., stamped sheet metal enclosure). In some embodiments, plate 14 may be welded or otherwise irremovably attached to fan 12. In other embodiments, plate 14 may be detachably attached to fan 12.

Fan assembly 10 may include other parts, such as housing for fan 12, fan guards, and electrical wiring. Fan tray assembly 10 may be included as a part of electronic equipment. For example, fan tray assembly 10 may be part of a chassis of a switch in a network. In another example, fan tray assembly 10 may be part of a chassis of a computer. In yet other example, fan tray assembly 10 may be part of a power supply unit in a network, and so on. In general, fan tray assembly 10 may be used to cool the computer or networking equipment of which it is a part. Hot air may enter a front 18 of fan 12 and be forced out, by the fan's action, through plurality of perforations 16.

For purposes of illustrating the techniques of fan tray assembly 10, it is important to understand the elements in a given system such as the system shown in FIG. 1. The following foundational information may be viewed as a basis from which the present disclosure may be properly explained. Such information is offered earnestly for purposes of explanation only and, accordingly, should not be construed in any way to limit the broad scope of the present disclosure and its potential applications.

Modular ventilation fan assemblies, called "fan trays" are used to mount cooling fans to electronic enclosures, such as switch chassis, computer chassis, etc. The fan trays include fans mounted in conductive enclosures to contain electromagnetic interference (EMI) generated by the electronic equipment. The fans are generally used for thermal management, to cool the electronic equipment. One or more fans may be included in each fan tray, depending on the cooling needs of the electronic equipment.

Fan trays typically provide metal plates on opposite sides of the fan to electromagnetically isolate the fan from the outside environment and the electronic equipment. The metal plates are perforated to allow for airflow. The higher the number of perforations in the metal plates, the lower the electromagnetic interference (EMI) shielding properties of the metal plates, which is not desired. However, lowering the number of perforations in the metal plates, lowers the thermal cooling properties of the fan tray, which is also not desired. Thus, there is a tradeoff between EMI shielding properties and thermal cooling properties when configuring the perforations on the metal plates.

Additionally, manufacturing constraints also affect perforation configuration. One method of making the perforations on the metal plate involve punching out the holes using a punch fabricated according to the perforation pattern. Another method involves punching out holes in the metal plates individually, one at a time, to achieve the desired pattern. Yet another method involves laser drilling the holes in the desired pattern. Various other methods may also be used as needed. Each of the manufacturing methods involves associated capital and operating costs.

Typical patterns of perforations include simple round or hexagonal perforations patterned in Cartesian co-ordinate system along straight X and Y directions (corresponding to the length and width of the metal plates). Such a pattern cannot match a fan's round shape, and therefore cannot provide sufficient airflow. If the patterns are cut out in the shape of the fan (with perforations along the perimeter of the fan's boundary being partially cut), the pattern is not aesthetically pleasing and cannot be manufactured in a cost-effective manner (e.g., faster tool wear out, higher wastage of materials, etc.). If the pattern is made in the cylindrical co-ordinate system, along the radial direction, for example, in simple geometric shapes (e.g., circle, square, hexagon, etc.), the pattern may match the fan's round shape, but may not provide sufficient EMI shielding or airflow. Moreover, the pattern may not fully utilize substantially all the available cutout space. Thus, the typical fan tray perforation area has uneven and non-uniform pattern that is both aesthetically unappealing and compromises airflow/EMI performance.

Fan tray assembly 10 is configured to address these issues (and others) in offering a fan tray perforation pattern 20 with enhanced air flow and better EMI shielding performance (among other advantages). Embodiments of fan tray assembly 10 can include pattern 20 comprising plurality of perforations 16. Pattern 20 can provide enhanced airflow through the fan, while minimizing EMI, conserving material, and providing an aesthetically pleasing design. Each of the perforations in pattern 20 may include a unique shape that may be a combination of straight lines and large curvature lines, patterned in a radial direction. Pattern 20 can provide electricity saving due to the fans running at lower speed, which can contribute to a greener environment with large savings in energy usage.

Each individual perforation in pattern 20 may be created from two large curvature lines and two straight lines. Then the individual perforation may be repeated in a radial direction by certain angle increments. After one layer of perforations is completed, the perforations may be repeated into a next layer with an incrementally larger radius. The number of perforations for the layers may be different from each other for optimal fill pattern and to maintain the uniform wall thickness between any two perforations (e.g., to improve manufacturability and airflow). The layers are repeated until the fan boundary. Resulting pattern 20 may be both beautiful and more functional than traditional fan tray patterns.

Embodiments of fan tray assembly 10 may have several advantages. Pattern 20 may match the fan's round shape, and may be aesthetically far superior to the traditional fan tray perforation patterns. The simple but elegant design of pattern 20 may be pleasing to look at. Pattern 20 can also provide a minimum 60% air-opening ratio whereas the traditional X-Y pattern offers around 55% at best. Moreover, pattern 20 may also outperform the traditional fan tray perforation by providing better EMI. For example, pattern 20 can provide at least 2 dB improvement in EMI compared to the traditional pattern. In some embodiments, pattern 20 may offer an aesthetic design that provides sufficient airflow, and EMI shielding, while using up substantially all available "donut shape" fan blade area down to a tiny fraction of a square inch.

Note that the numerical and letter designations assigned to the elements of FIG. 1 do not connote any type of hierarchy; the designations are arbitrary and have been used for purposes of teaching only. Such designations should not be construed in any way to limit their capabilities, functionalities, or applications in the potential environments that may benefit from the features of fan tray assembly 10. It should be understood that the fan tray assembly 10 shown in FIG. 1 is simplified for ease of illustration.

Figure 2A:
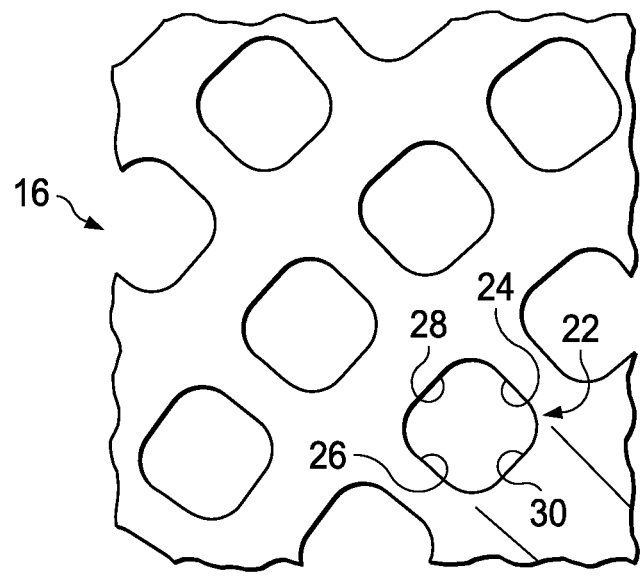
FIGS. 2A and 2B are simplified diagrams illustrating example details of the fan tray assembly in accordance with one embodiment.
Figure 2B:
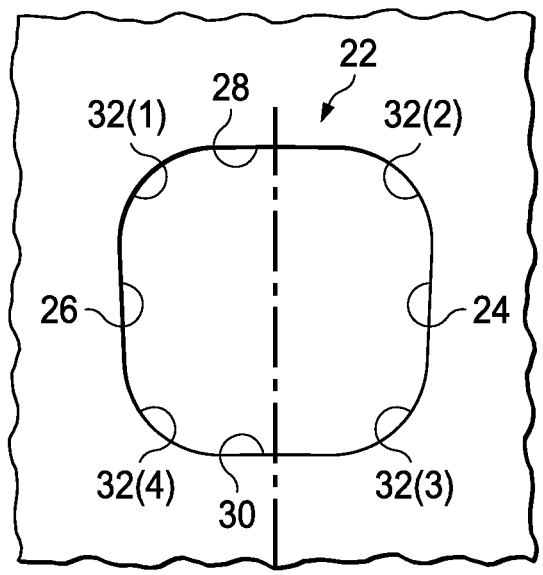

Turning to FIGS. 2A and 2B, FIGS. 2A and 2B are simplified diagrams showing details of an individual perforation 22 according to an embodiment of fan tray assembly 10. Perforation 22 includes two non-parallel straight lines 24 and 26 and two large curvature lines 28 and 30. Lines 24 and 26 may originate at an imaginary circle centered at fan 12's center, to form an angle with its vertex at the center. Curved lines 28 and 30 may be portions of concentric circles with their common center corresponding to the fan's center. Perforation 22 may be patterned in small angular increments around fan 12's center. Perforations 16 may be patterned in concentric circles, forming layers from a small circle corresponding to an inner radius of fan 12 to a large circle corresponding to an outer radius of fan 12.

FIG. 2B shows perforation 22 in detail. Perforation 22 includes four edges 24, 26, 28, and 30. Edges 24 and 26 may be portions of non-parallel angular lines with their vertex at fan 12's center. Edges 28 and 30 may be portions of concentric circles having their common center at fan 12's center. Perforation 22 may be rounded out at the corners by curves 32(1)-32(4). In some embodiments, curves 32(1)-32(4) may have any suitable radius that provides a pleasing aesthetic appearance.

Figure 3:
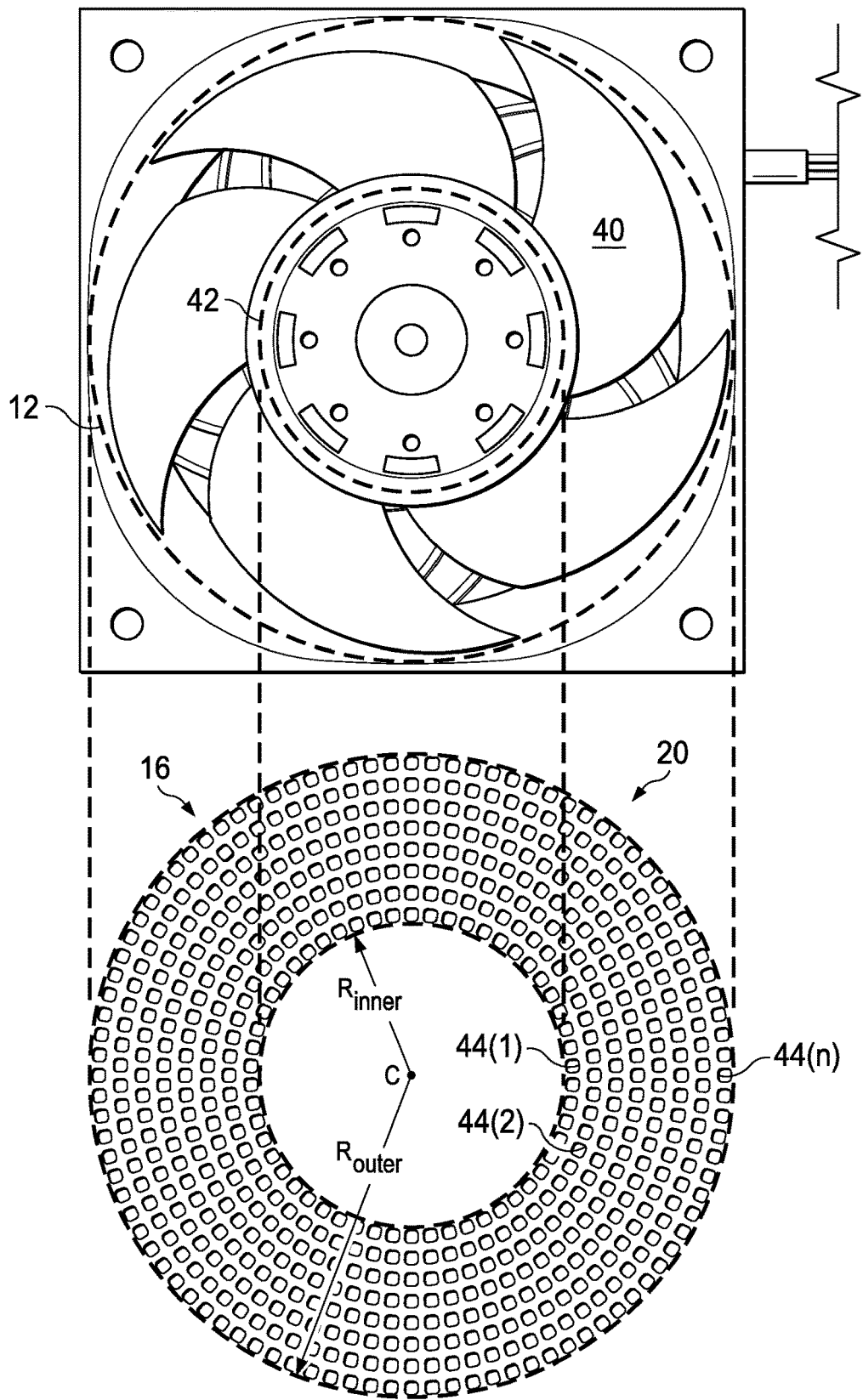
FIG. 3 is a simplified diagram illustrating other example details associated with an example embodiment of the fan tray assembly.

Turning to FIG. 3, FIG. 3 is a simplified diagram of a fan and pattern 20 of perforations 16 according to an embodiment of fan tray assembly 10. Fan 12 may comprise blades 40 attached to an approximately circular inner portion 42. Fan 12 may have an approximately circular outer contour with a radius $R_{outer}$. A rotary part of fan 12 (e.g., including fans 40) may have an inner radius $R_{inner}$ (corresponding to the radius of the inner portion). Pattern 20 may be bounded on an inner perimeter by an imaginary circle with radius $R_{inner}$, and bounded on an outer perimeter by another imaginary circle with radius $R_{outer}$, both circles being centered on a common point C. Perforations 16 may be arranged in (imaginary) concentric circles forming layers 44(1)-44(n), all centered on point C, with the smallest concentric circle having radius greater than or equal to $R_{inner}$, and the largest concentric circle having radius smaller than or equal to $R_{outer}$.

Figure 4A:
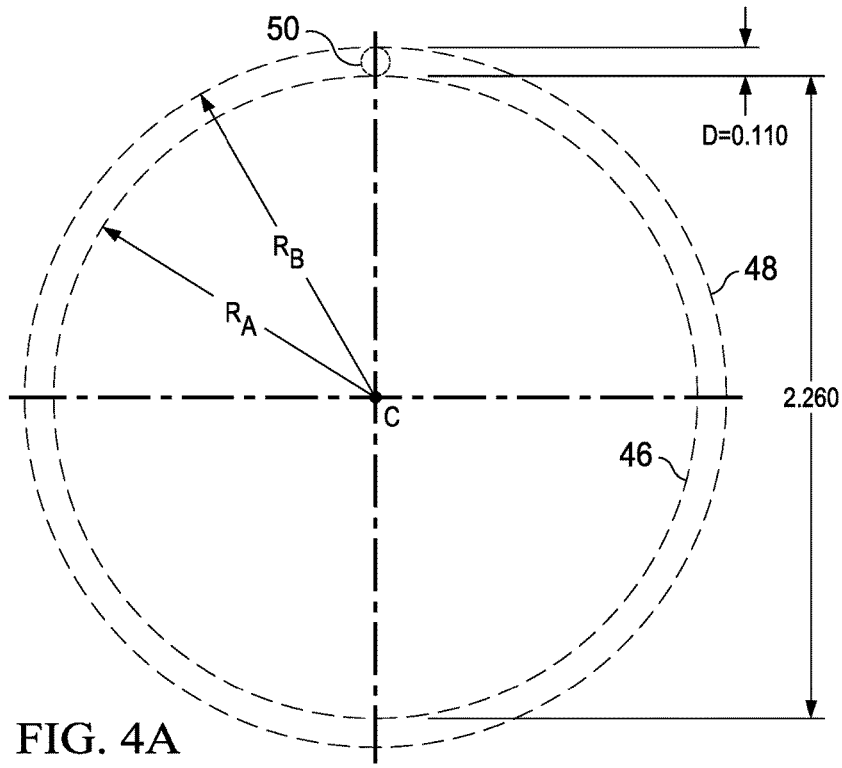
FIGS. 4A to 4G are simplified diagrams illustrating other example details of the fan tray assembly in accordance with an embodiment.

Turning to FIGS. 4A to 4F, FIGS. 4A to 4F are simplified diagrams illustrating an example method to create perforation 22 and pattern 20 according to an embodiment of fan tray assembly 10. Initially, cutouts are drawn according to pattern 20, where each cutout corresponds to perforation 22. As used herein, the term "cutout" can include a rendering of a perforation, for example, drawn on paper, displayed on a computer screen, etc. In FIG. 4A, two circles 46 and 48 may be drawn around point C, with radii $R_A$ and $R_B$ ($R_B > R_A$), such that $R_A < R_{inner}$ and ($R_B - R_A$) corresponds to D, a length of perforation 22. In an example embodiment, $R_A = 2.260"$ and D=0.110". A third circle 50 of diameter D may be drawn between circles 46 and 48, centered at a distance $(R_A + R_B)/2$ from point C.

Figure 4B:
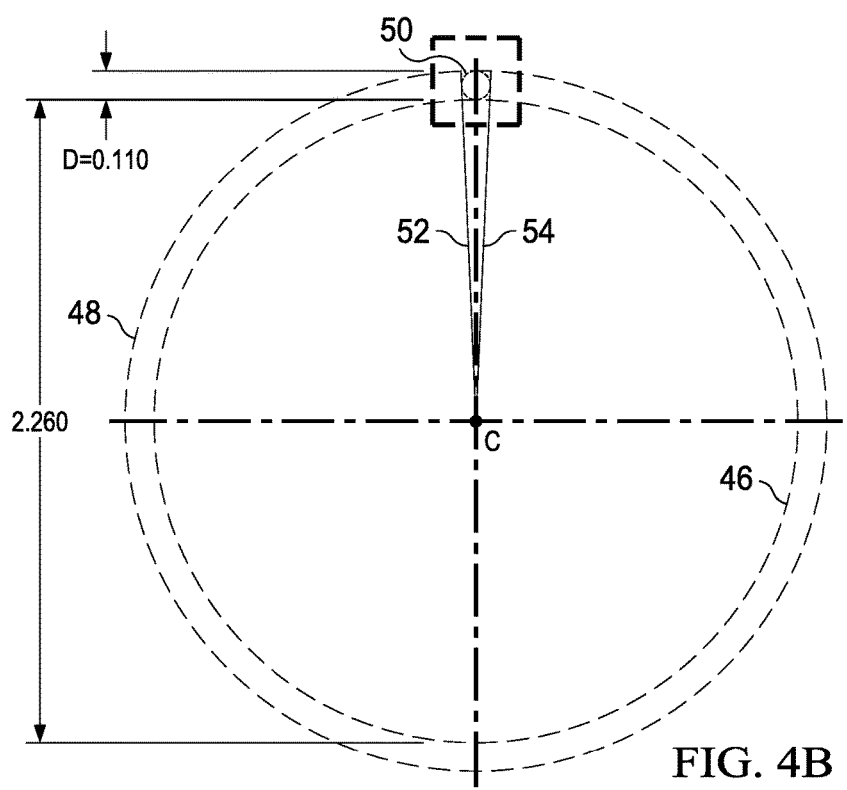
Figure 4C:
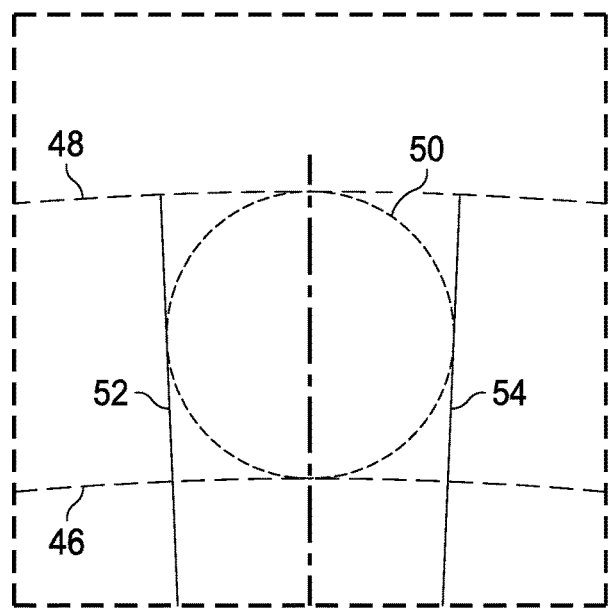
Figure 4D:
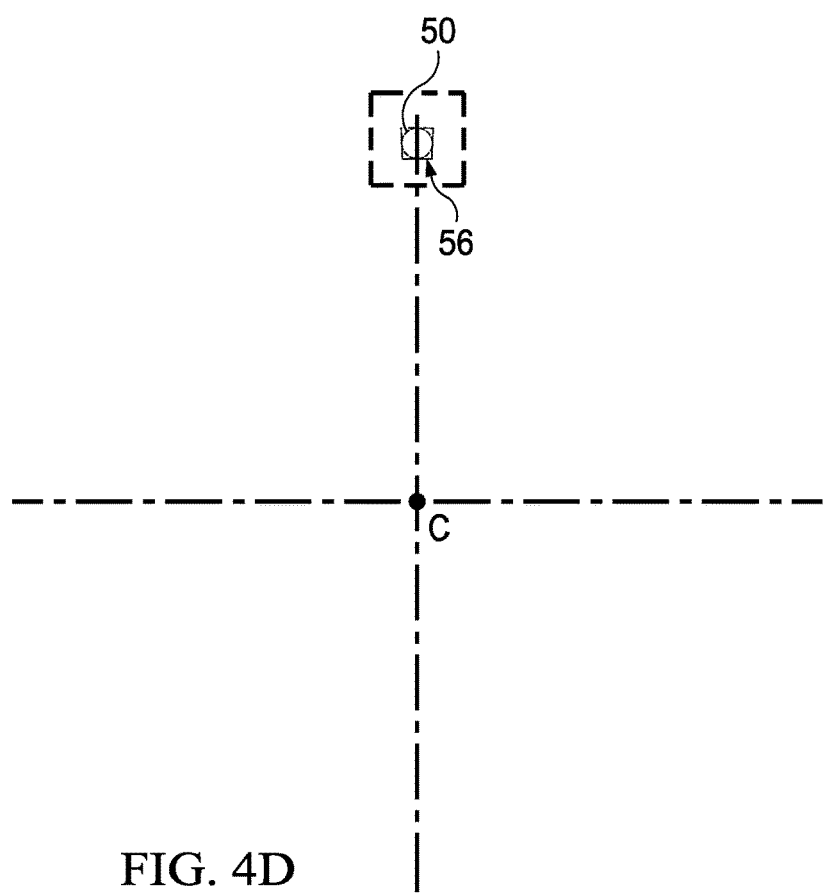
Figure 4E:
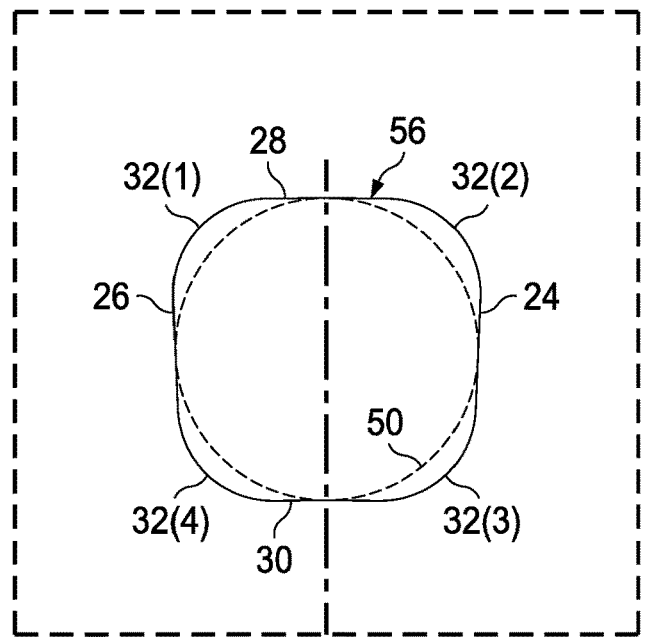

In FIG. 4B, two non-parallel lines 52 and 54 may be added, forming an angle with vertex at point C. Lines 52 and 54 may be tangent to circle 50. FIG. 4C shows circle 50 in detail. Circles 46 and 48 and lines 52 and 54 may be tangential to circle 50. In FIG. 4D, excess portions (e.g., that are not near circle 50) of circles 46 and 48 and lines 52 and 54 may be erased (e.g., trimmed) to generate a rough outline of cutout 56. As shown in detail in FIG. 4E, a final outline of cutout 56 may be generated by rounding the corners of the rough outline with curves 32(1)-32(4). In the embodiment illustrated in FIG. 4E, radius of curves 32(1)-32(4) is 0.035". Any suitable radius may be chosen for curves 32(1)-32(4) within the broad scope of the embodiments.

Figure 4F:
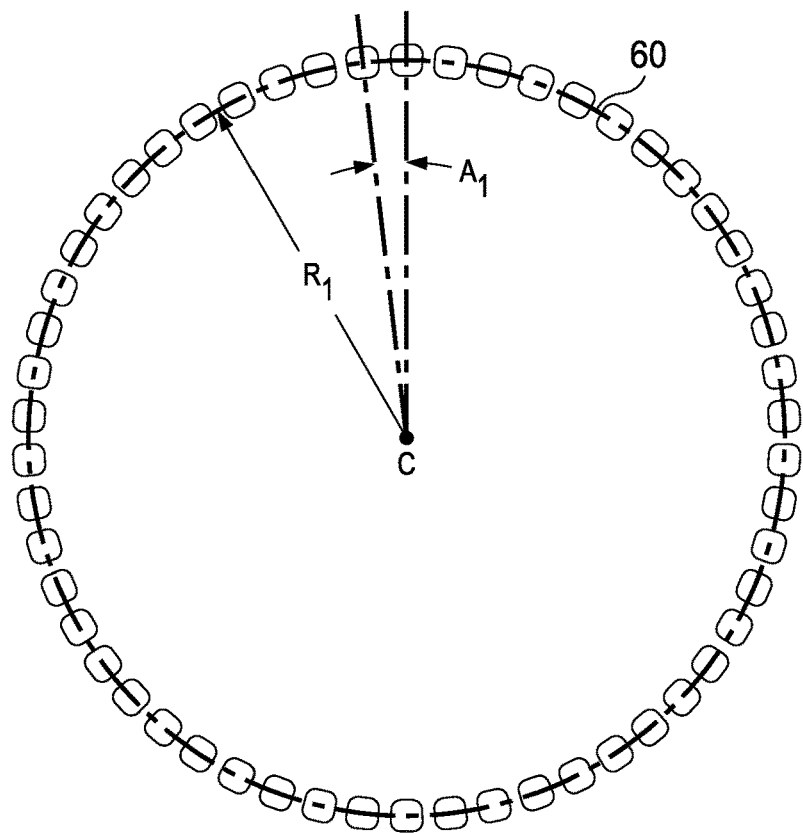

Turning to FIG. 4F, cutout 56 may be replicated $X_1$ times (e.g., 50 times) around point C along an imaginary circle 60 of radius $R_1$ (=$(R_A + R_B)/2$), with each cutout uniformly angularly spaced by angle A1 from the adjacent cutouts. In some embodiments, $X_1$ may be calculated as the nearest integer less than the perimeter ($2\pi R_1$) of circle 60. In other embodiments a distance d between cutouts may be predetermined (e.g., according to thickness of plate 14, and for other manufacturing considerations) and $X_1$ may be calculated as the total integer number of cutouts spaced d apart that can be placed along circle 60. Angle $A_1$ may be calculated as $360°/X_1$. Cutouts along circle 60 may correspond to a first layer 44(1) of perforations 16 in pattern 20.

Figure 4G:
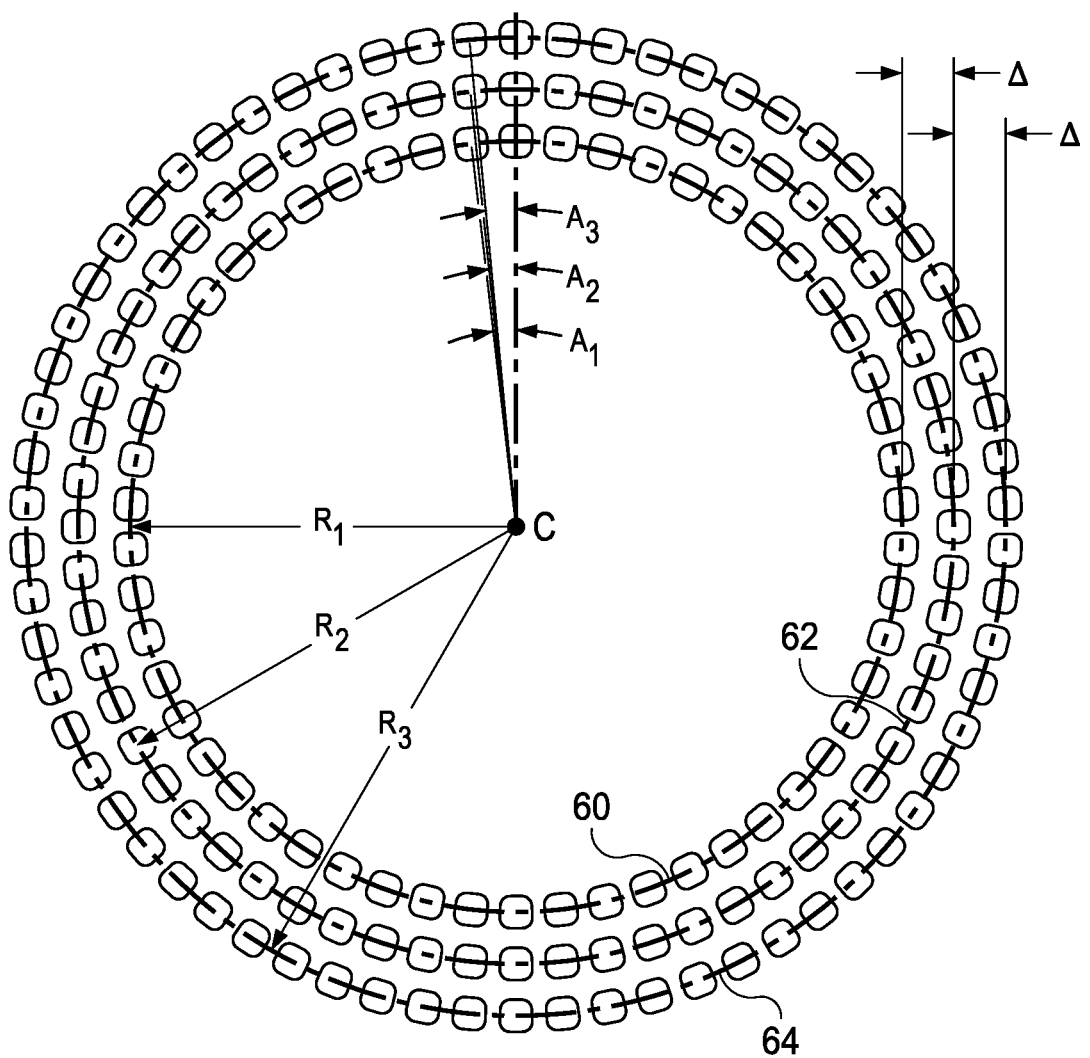

Turning to FIG. 4G, cutout 56 may be replicated on another circle 62 concentric with circle 60, centered at C, with radius $R_2 = R_1 + \Delta$, where $\Delta$ is a suitably small number. In some embodiments, $\Delta$ may be calculated based on the distance d between cutouts and size of cutout 56 (e.g., $\Delta = D + d$). Cutout 56 on circle 62 may be replicated $X_2$ number of times, each cutout uniformly angularly spaced at angle $A_2$ from each other. In some embodiments, $A_2$ may be smaller than $A_1$, so that cutouts are spaced d apart azimuthally and radially. Cutouts along circle 62 may form a second layer 44(2) of perforations 16 in pattern 20.

Similarly, cutout 56 may be replicated on yet another circle 64 centered at C with radius $R_3 = R_2 + \Delta$. The cutouts in circle 64 may be uniformly angularly spaced at angle $A_3$ from each other ($A_3 < A_2 < A_1$), with $X_3$ number of cutouts in circle 62. Cutouts along circle 64 may form a third layer 44(3) of perforations 16 in pattern 20. The cutouts may be replicated until pattern 20 is filled (e.g., radius of largest concentric circle exceeds $R_{outer}$ of fan).

In various embodiments, pattern 20 may be transferred to a manufacturing equipment (such as a stamp, or laser cutter), and perforations 16 generated on plate 14 according to pattern 20. Plate 14 may be composed of any suitable material (e.g., metal, plastic, wood, fibers, etc.). In some embodiments, where plate 40 and fan 12 are used in switches and other electronic equipment, plate 14 may be made of metal, to enhance EMI shielding performance.

Turning to FIG. 5, FIG. 5 is a simplified flow diagram illustrating example operations that may be associated with generating pattern 20 according to an embodiment of fan tray assembly 10. Operations 100 may start at 102 and proceed to 104, at which circular fan 12 may be provided with inner perimeter of radius $R_{inner}$ and outer perimeter of $R_{outer}$ from center C. At 106, first circle 46 may be drawn with center C and radius $R_A$ ($R_A \geq R_{inner}$). At 108, second circle 48 may be drawn with center C and radius $R_B$, such that $R_B > R_A$ and $R_B \leq R_{outer}$, and ($R_B - R_A = D$). At 110, third circle 50 may be drawn between circles 46 and 48 with diameter D and center at a distance $(R_A + R_B)/2$ from C.

At 112, two non-parallel lines 52 and 54 may be added, originating at center C and tangent to circle 50, to create a rough outline of cutout 56. At 114, excess lines and large circles may be trimmed outside the rough outline of cutout 56. At 116, rounded corners may be added to rough outline 56 to create a final outline of cutout 56. Cutout 56 may be centered at distance $(R_A + R_B)/2$ from center C. At 118, a counter i may be set to 1. At 120, a radius $R_i$ may be set to $(R_A + R_B)/2$, corresponding to the distance of cutout 56 from center C. At 122, a determination may be made whether $R_i > R_{outer}$.

If $R_i$ is not greater than $R_{outer}$, at 124, $X_i$, the number of cutouts that can fit in circle 60 with center C and radius $R_i$, and spaced d apart may be calculated. At 126, angle $A_i$ between adjacent cutouts on circle 60 may be calculated as $360°/X_i$. At 128, cutout 56 may be replicated Xi number of times at angle $A_i$ around center C. The cutouts on circle 60 may correspond to layer 40(1) of perforations 16 in pattern 20. At 130, $\Delta$ may be calculated as D+d. At 132, counter i may be incremented by 1 to i+1. Radius $R_i$ may be calculated to be $R_{i-1} \alpha \Delta$. The operations may loop back to 122 and continue until $R_i > R_{outer}$, at which point, the operations may end at 138, when pattern 20 is completed.

Figure 6:
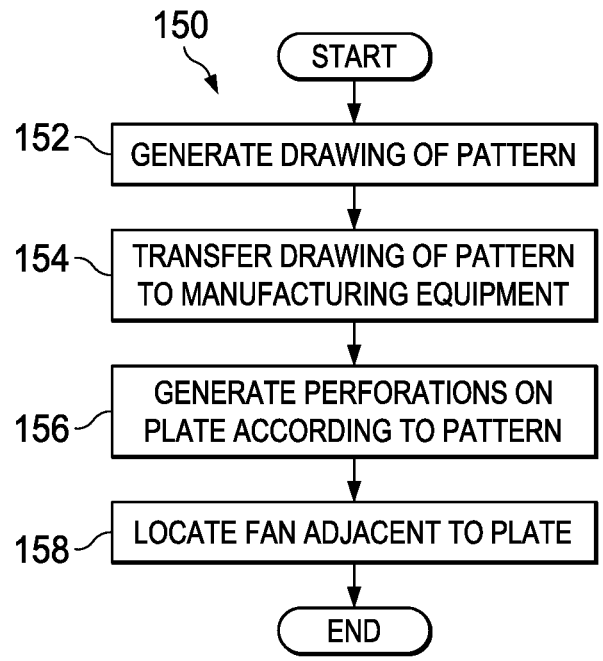
FIG. 6 is a simplified flow diagram illustrating yet other example operations that may be associated with an embodiment of the fan tray assembly.

Turning to FIG. 6, FIG. 6 is a simplified flow diagram illustrating example operations that may be associated with an embodiment of fan tray assembly 10. Operations 150 may include 152, at which a drawing of pattern 20 may be created (e.g., according to operations 100). At 154, the drawing of pattern 20 may be transferred to suitable manufacturing equipment (e.g., stamp, forge, lathe, computer numerical controlled (CNC) machine, laser cutter, driller, etc.). At 156, perforations 16 may be generated on plate 14 according to pattern 20.

Figure 7:
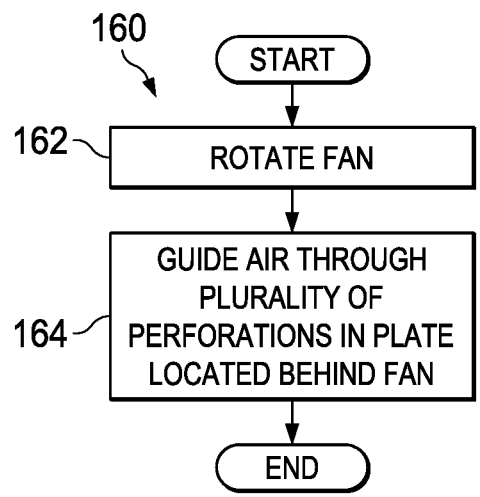
FIG. 7 is a simplified flow diagram illustrating yet other example operations that may be associated with an embodiment of the fan tray assembly.

Turning to FIG. 7, FIG. 7 is a simplified flow diagram illustrating example operations that may be associated with an embodiment of fan tray assembly 10. Operations 160 may include 162, at which fan 12 may be rotated. At 164, air may be guided through plurality of perforations 16 in plate 14 located behind fan 12, such that air flows from fan 12 towards plate 14.

In terms of the dimensions of the articles discussed herein (e.g., the fan, the plate, the pattern, etc.), any suitable length, width, and depth (or height) may be used and can be based on particular end user needs, or specific elements to be addressed by the apparatus (or the system in which it resides). It is imperative to note that all of the specifications and relationships outlined herein (e.g., height, width, length, hole diameter, # holes per unit of area, etc.) have only been offered for purposes of example and teaching only. Each of these data may be varied considerably without departing from the spirit of the present disclosure, or the scope of the appended claims. The specifications apply only to one non-limiting example and, accordingly, should be construed as such. Along similar lines, the materials used in constructing the articles can be varied considerably, while remaining within the scope of the present disclosure.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is imperative to note that countless possible design configurations can be used to achieve the operational objectives outlined here. Accordingly, the associated infrastructure of fan tray assembly 10 may have a myriad of substitute arrangements, design choices, device possibilities, hardware configurations, equipment options, etc. It is also important to note that the operations and steps described with reference to the preceding FIGURES illustrate only some of the possible scenarios that may be executed by, or within, the system. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure. For example, although the present disclosure has been described with reference to a fan tray, fan tray assembly 10 may be applicable to other devices where a similar pattern of holes may be desired.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method, comprising:
    guiding air through a plurality of perforations on a plate proximate to a rotating fan, wherein the perforations are arranged in concentric circles centered at a point, wherein each of the perforations is a closed shape comprising four edges that are tangential to a hypothetical circle located inside the perforation, wherein two opposite edges of each perforation comprise non-parallel straight lines, and two other opposite edges comprise curved lines.

2. The method of claim 1, wherein the fan is substantially circular with an inner radius corresponding to an inner perimeter of the pattern and an outer radius corresponding to an outer perimeter of the pattern.

3. The method of claim 1, wherein each perforation comprises at least a first edge, a second edge, a third edge and a fourth edge, wherein the first edge and the second edge comprise the non-parallel straight lines, wherein the third edge and the fourth edge comprise concentric circles of a first radius and a second radius respectively.

4. The method of claim 1, wherein each perforation has rounded corners.

5. The method of claim 1, wherein each perforation is separated by uniform angle increments in an azimuthal direction from adjacent perforations located on a common concentric circle.

6. The method of claim 1, wherein the perforations are spaced apart equally in both azimuthal and radial directions.

7. An apparatus, comprising:
    a plate comprising a plurality of perforations arranged in concentric circles centered at a point, wherein each of the perforations is a closed shape comprising four edges that are tangential to a hypothetical circle located inside the perforation, wherein two opposite edges of each perforation comprise non-parallel straight lines, and two other opposite edges comprise curved lines.

8. The apparatus of claim 7, wherein each perforation comprises at least a first edge, a second edge, a third edge and a fourth edge, wherein the first edge and the second edge comprise the non-parallel straight lines, wherein the third edge and the fourth edge comprise concentric circles of a first radius and a second radius respectively.

9. The apparatus of claim 8, wherein a diameter of the hypothetical circle is equal to a difference between the first radius and the second radius.

10. The apparatus of claim 7, wherein each perforation is separated by uniform angle increments in an azimuthal direction from adjacent perforations located on a common concentric circle.

11. The apparatus of claim 7, wherein the perforations are spaced apart equally in both azimuthal and radial directions.

12. The apparatus of claim 7, wherein any two perforations are uniformly spaced from each other.

13. The apparatus of claim 7, wherein the pattern is bounded within an inner circle having an inner radius and an outer circle having an outer radius, wherein the apparatus further comprises a circular fan having the inner radius and the outer radius, wherein the plate is aligned parallel to the fan.

14. The apparatus of claim 13, wherein rotation of the fan causes air to be pushed out through the plurality of perforations.

15. The apparatus of claim 7, wherein the plate is made of a material providing electromagnetic interference (EMI) shielding.

16. The apparatus of claim 7, wherein the apparatus is attached to electronic equipment.

17. The apparatus of claim 16, wherein the electronic equipment comprises a switch in a network.

18. A method, comprising:
   generating a pattern on a planar surface, the pattern comprising a plurality of perforations arranged in concentric circles centered at a point, wherein each of the perforations is a closed shape comprising four edges that are tangential to a hypothetical circle located inside the perforation, wherein two opposite edges of each perforation comprise non-parallel straight lines, and two other opposite edges comprise curved lines; and
   cutting out the plurality of perforations.

19. The method of claim 18, wherein the concentric circles have mutually different number of perforations.

20. The method of claim 18, wherein each perforation has rounded corners.

* * * * *